US008410544B2

(12) United States Patent
Chan et al.

(10) Patent No.: US 8,410,544 B2
(45) Date of Patent: Apr. 2, 2013

(54) FINFETS AND METHODS OF MAKING SAME

(75) Inventors: Kevin K. Chan, Yorktown Heights, NY (US); Thomas Safron Kanarsky, Hopewell Junction, NY (US); Jinghong Li, Hopewell Junction, NY (US); Christine Qiqing Ouyang, Yorktown Heights, NY (US); Dae-Gyu Park, Hopewell Junction, NY (US); Zhibin Ren, Hopewell Junction, NY (US); Xinhui Wang, Yorktown Heights, NY (US); Haizhou Yin, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/228,519

(22) Filed: Sep. 9, 2011

(65) Prior Publication Data

US 2011/0316081 A1    Dec. 29, 2011

Related U.S. Application Data

(62) Division of application No. 12/561,606, filed on Sep. 17, 2009, now Pat. No. 8,043,920.

(51) Int. Cl.
*H01L 29/66* (2006.01)

(52) U.S. Cl. . 257/328; 257/331; 257/401; 257/E29.022; 257/E29.024; 438/300

(58) Field of Classification Search .................. 438/300; 257/328, 331, 401, E29.022, E29.024
See application file for complete search history.

(56) References Cited

U.S. PATENT DOCUMENTS

| 6,787,476 | B1 * | 9/2004 | Dakshina-Murthy et al. ............... 438/740 |
| 6,858,478 | B2 * | 2/2005 | Chau et al. ................. 438/149 |
| 6,974,983 | B1 * | 12/2005 | Hill et al. ................... 257/292 |
| 7,199,419 | B2 | 4/2007 | Haller |
| 7,326,656 | B2 * | 2/2008 | Brask et al. ................ 438/785 |
| 7,692,254 | B2 * | 4/2010 | Anderson et al. ............ 257/401 |
| 7,851,865 | B2 | 12/2010 | Anderson et al. |
| 2011/0049583 | A1 | 3/2011 | Lin et al. |

OTHER PUBLICATIONS

Restriction (Mail Date Mar. 11, 2011) for U.S. Appl. No. 12/561,606, filed Sep. 17, 2009, First Named Inventor Kevin K. Chan.
Office Action Ex parte Quayle (Mail Date May 11, 2011) for U.S. Appl. No. 12/561,606, filed Sep. 17, 2009, First Named Inventor Kevin K. Chan.
Notice of Allowance (Mail Date Jun. 20, 2011) for U.S. Appl. No. 12/561,606, filed Sep. 17, 2009, First Named Inventor Kevin K. Chan.

* cited by examiner

*Primary Examiner* — Jarrett Stark
*Assistant Examiner* — Nicholas Tobergte
(74) *Attorney, Agent, or Firm* — Schmeiser, Olsen & Watts; Parashos Kalaitzis (57) ABSTRACT

A method of fabricating and a structure of a merged multi-fin finFET. The method includes forming single-crystal silicon fins from the silicon layer of an SOI substrate having a very thin buried oxide layer and merging the end regions of the fins by growing vertical epitaxial silicon from the substrate and horizontal epitaxial silicon from ends of the fins such that vertical epitaxial silicon growth predominates.

20 Claims, 8 Drawing Sheets

FINFETS AND METHODS OF MAKING SAME

RELATED APPLICATIONS

This application is a division of U.S. patent application Ser. No. 12/561,606 filed on Sep. 17, 2009.

FIELD OF THE INVENTION

The present invention relates to the field of semiconductor transistors; more specifically, it relates to finFETs and methods of fabricating finFETs.

BACKGROUND OF THE INVENTION

Fin field effect transistors (finFETs) are a leading candidate to replace planer metal-oxide-silicon field effect transistors (MOSFETs). However an issue with finFETs is increased parasitic resistance as the fin width is scaled down in size. Accordingly, there exists a need in the art to mitigate the deficiencies and limitations described hereinabove.

SUMMARY OF THE INVENTION

A first aspect of the present invention is a method, comprising: (a) forming two or more silicon fins on a top surface of an insulating layer on a silicon substrate, each fin of the two or more fins having a central region between and abutting first and second end regions and opposite sides; (b) forming a gate dielectric layer on the opposite sides of each fin of the two or more fins; (c) forming an electrically conductive gate over the gate dielectric layer over the central region of each fin of the of two or more fins; (d) removing the gate dielectric layer from the first and second end regions of each fin of the two or more fin and removing the end regions of each of the two or more fins to form exposed opposite first and second ends of the central regions of each fin of the two or more fins; after (d), (e) removing the insulating layer to expose first and second regions of the substrate on opposite sides of the gate; and after (e), (f) simultaneously growing epitaxial silicon from the first and second regions of the substrate and from the first and second ends of the central regions of each fin of the two or more fins to form respective first and second merged source/drains.

A second aspect of the present invention is a structure comprising: two or more silicon fins on a top surface of an insulating layer, the insulating layer on a silicon substrate, each fin of the two or more fins having opposite sidewalls connecting opposite first and second ends; a gate dielectric layer on the sides of each fin of the two or more fins; an electrically conductive gate over the gate dielectric layer; first and second regions of the substrate on opposite sides of the gate; a first merged source/drain comprising first epitaxial silicon regions extending from the first region of the silicon substrate and abutting second epitaxial regions extending from the first ends of each fin of the two or more fins; and a second merged source/drain comprising third epitaxial silicon regions extending from the second region of the silicon substrate and abutting fourth epitaxial regions extending from the second ends of each fin of the two or more fins.

These and other aspects of the invention are described below.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

FinFETs are less susceptible to short-channel-effect (SCE) because of the ability to form double-gated devices. However, as fin sizes decrease the parasitic resistance $R_{ext}$ does not scale. The present invention uses multi-fin devices having merged source/drains to reduce the $R_{ext}$. The embodiments of the present invention "merge" fins using epitaxial growth, but minimizes $R_{ext}$ and parasitic capacitance $C_{ov}$, by minimizing total source-drain height so the fins merge predominately by epitaxial growth from the silicon substrate instead of the from fin sidewall. This requires the use of thinner than normal buried oxide layers in the silicon-on-insulator (SOI) substrates on which the finFETs are fabricated.

Figure 1:
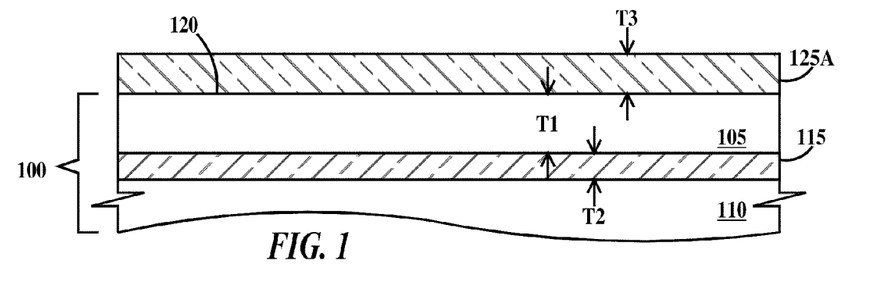
FIGS. 1 through 20 illustrate fabrication of finFETs according to embodiments of the present invention.

FIGS. 1 through 20 illustrate fabrication of finFETs according to embodiments of the present invention. FIG. 1 is a cross-sectional view of a starting substrate for fabrication of a merged-fin finFET. In FIG. 1, an SOI substrate 100 includes a single-crystal silicon layer 105 separated from a supporting single-crystal silicon substrate 110 by a buried oxide (BOX) layer (or insulating layer) 115. Formed on a top surface 120 of silicon layer 105 is an optional dielectric capping layer 125A. Top surface 120 of silicon layer 105 is coplanar with a {100} crystal plane of silicon layer 105. SOI substrate 100 is typically in the form of thin disk called a wafer, having typical diameters of 100 mm, 200 mm and 300 mm and between about 200 microns to about 750 microns thick. Silicon layer 105 has a thickness T1. In one example, T1 is between about 5 nm and about 100 nm. BOX layer 115 has a thickness T2. In one example, T2 is between about 20 nm and about 40 nm, with about 25 nm preferred. In conventional SOI substrates the BOX layer is about 145 nm or more thick. The relative thinness of BOX layer 115 maximizes desirable fin merge by vertical epitaxial growth from substrate 110 while minimizing undesirable fin-merge by horizontal epitaxial from the sides of the fins as illustrated in FIG. 17 and described infra. Capping layer 125A has a thickness T3. In one example, T3 is between about 0 nm and about 200 nm. In one example capping layer 125A comprises silicon nitride. When capping layer 125A is present, the resultant finFET will be dual-gated (the gate will be formed on gate dielectric on opposite sidewalls of the fin). When capping layer 125A is not present, the resultant finFET will be tri-gated (the gate will be formed on gate dielectric on opposite sidewalls of the fin and on the gate dielectric on the top surface of the fin).

Figure 2:
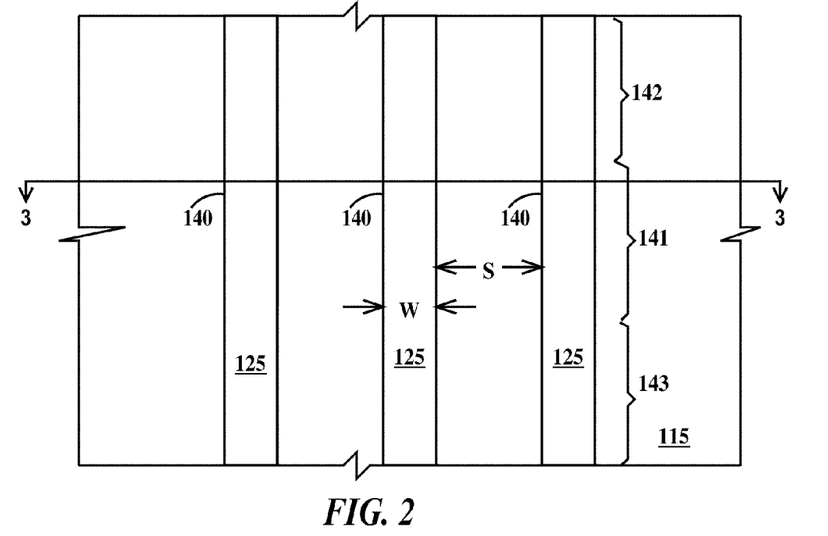
Figure 3:
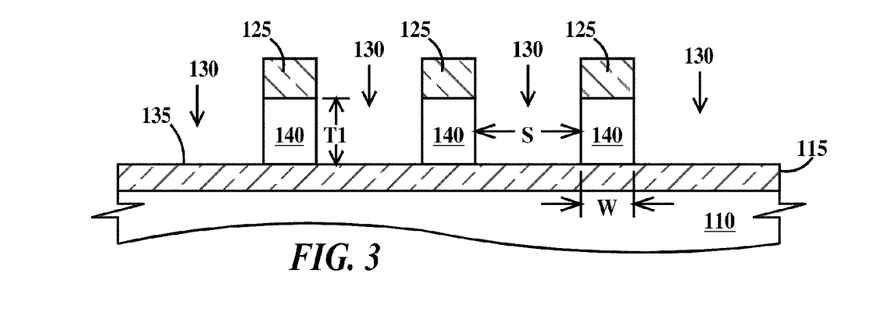

FIG. 2 is a top view and FIG. 3 is a cross-sectional view through line 3-3 of FIG. 2. In FIGS. 2 and 3, trenches 130 have been etched through capping layer 125A and silicon layer 105 (see FIG. 1) down to a top surface 135 of BOX layer 115 to define fins 140 capped by dielectric caps 125. Each of fins 140 is a rectangular block of silicon having a central region 141 and opposite first and second end regions 142 and 143. Fins 140 have a height T1, a width W and are spaced apart a distance S. In one example, W is between about 5 nm and about 40 nm. In one example, S is between about 15 nm and about 100 nm. FIGS. 4, 5, 6 and 7 are sections taken through the plane defined by line 3-3 of FIG. 2. While three fins 140 are illustrated in FIGS. 2 and 3, there may be a few as two or more than three.

Figure 4:
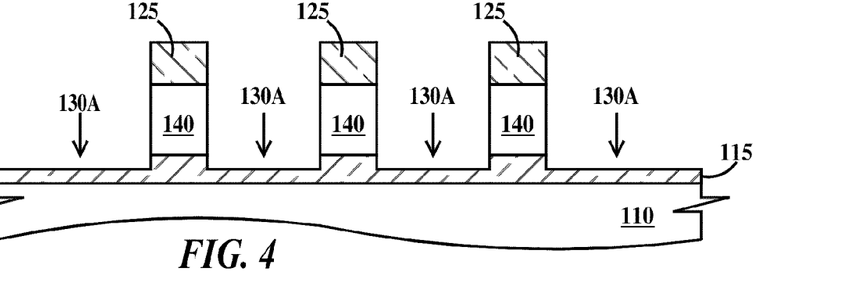

In FIG. 4, a gate dielectric preclean is performed, which recesses BOX layer 115 where the BOX layer is not protected by fins 140. In one example, the preclean is an aqueous buffered (with $NH_4OH$) HF or dilute HF. The preclean etches recesses 130A into BOX layer 115 part way but not through BOX layer 115.

Figure 5:
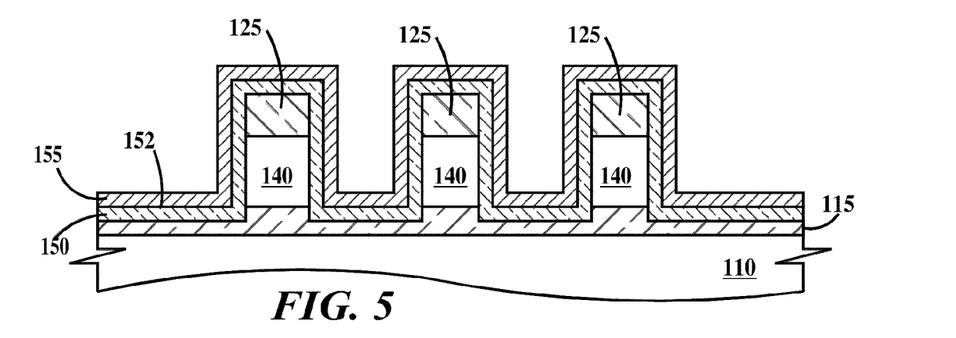

In FIG. 5, a conformal gate dielectric layer 150 is formed on all exposed surfaces of BOX layer 115, fins 140 and dielectric caps 125. In one example gate dielectric layer 150 is a high dielectric constant (k) material, examples of which include but are not limited metal oxides such as $Ta_2O_5$, $BaTiO_3$, $HfO_2$, $ZrO_2$, $Al_2O_3$, or metal silicates such as $HfSi_xO_y$, or $HfSi_xO_yN_z$ or combinations thereof. A layer of $HfO_2$ is preferred. A high K dielectric material has a relative permittivity above about 10. In one example, gate dielectric layer 150 is about 0.5 nm to 20 nm thick. Also in FIG. 5, an optional conformal depletion stop layer 155 is formed on a top surface 152 of gate dielectric layer 150. Depletion stop layer 155 prevents diffusion of dopant from the gate (not shown, see FIGS. 8 and 9) through gate dielectric layer into fins 140 or vice versa. In one example, depletion stop layer is a metal or metal nitride layer such as Ti, Ta, W, TiN or TaN with a layer of TiN preferred. In one example, depletion stop layer 155 is about 0.5 nm to 20 nm thick.

Figure 6:
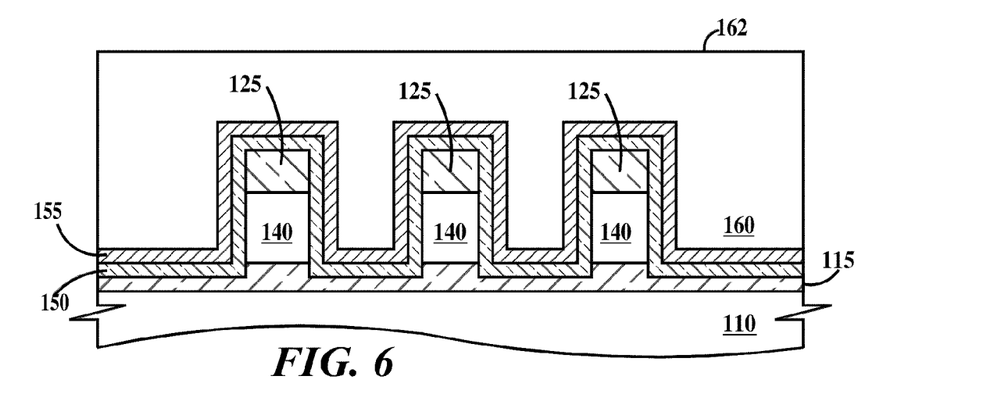

In FIG. 6, a blanket polysilicon layer 160 has been deposited (e.g., by a chemical-vapor deposition (CVD)) on depletion stop layer 155 and a chemical mechanical polish (CMP) performed to planarize a top surface 162 of polysilicon layer 160. Polysilicon layer 160 may be doped (P-type for a P channel-finFET, N-type for an N channel-finFET) or undoped.

Figure 7:
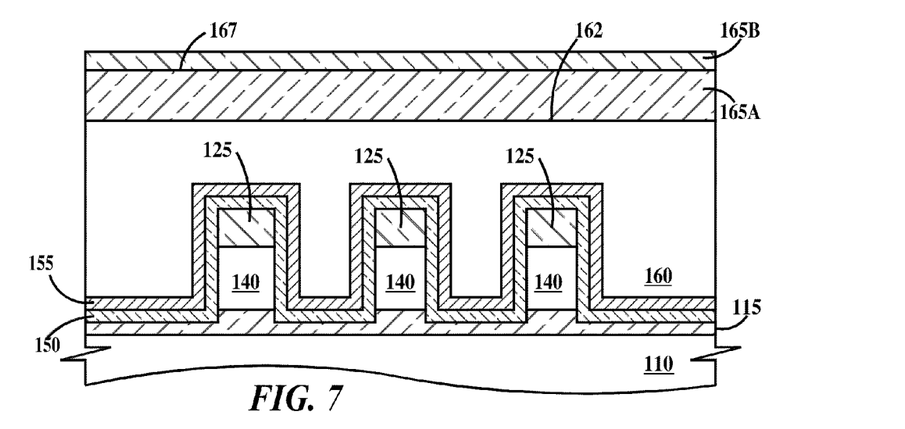

In FIG. 7, a dielectric first hardmask layer 165A is formed in top surface 162 of polysilicon layer 160 and a dielectric second hardmask layer 165B formed on a top surface 167 of first hardmask layer 165A. In one example, first hardmask layer 165A is silicon nitride and second hardmask layer 165B is a deposited silicon oxide.

Figure 8:
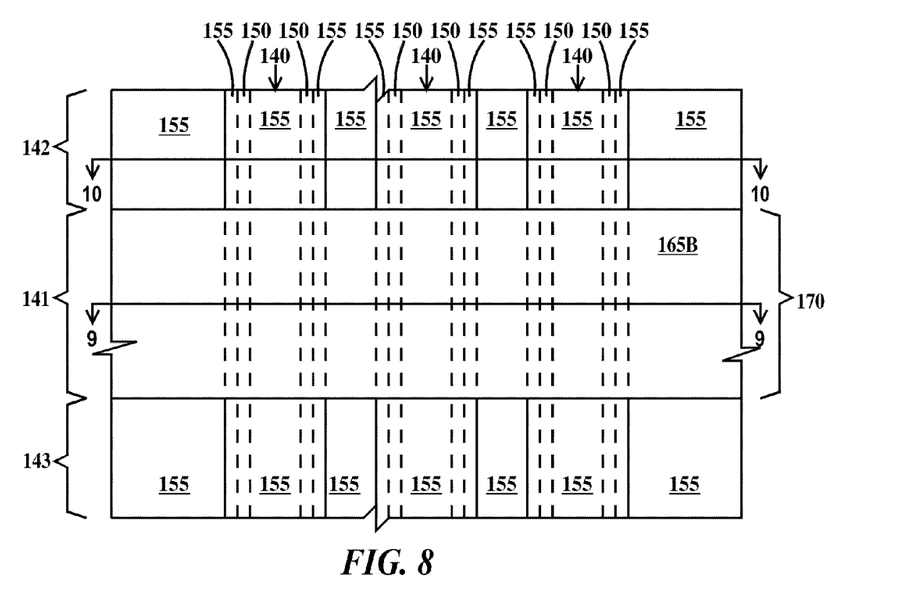
Figure 9:
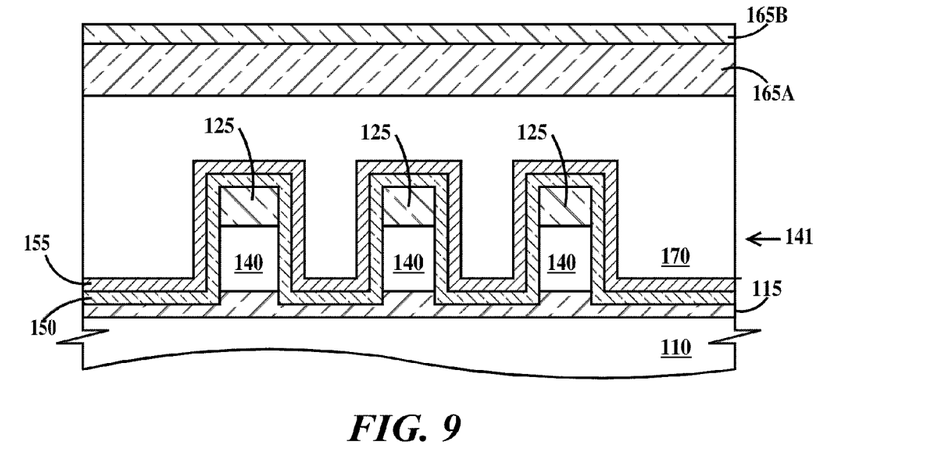
Figure 10:
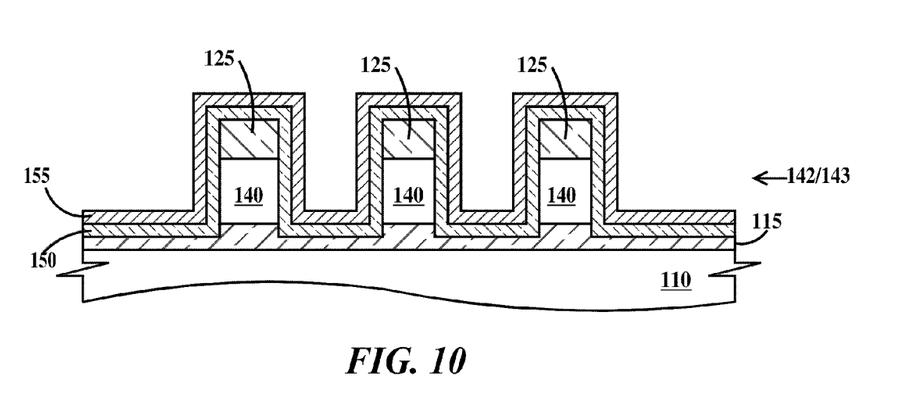

FIG. 8 is a top view, FIG. 9 is a cross-section view through line 9-9 of FIG. 8 and FIG. 10 is a cross-section view through line 10-10 of FIG. 8 after a photolithographic/etch process to define an electrically conductive gate 170 (see FIGS. 8 and 9) by selective removal of first and second hardmask layers 165A and B and polysilicon layer 160. In FIG. 10, first and second hardmask layers 165A and 165B and polysilicon layer 160 have been removed from end regions 142 and 143 (see FIG. 8). In FIG. 9, first and second hardmask layers 165A and 165B and polysilicon layer 160 have not been removed from central regions 141 (see FIG. 8) and remain. Gate 170 is formed over both sides and the top of fins 140, but dielectric caps 125 are thick enough so no channel can form along the top surfaces of the fins when voltage is applied to the gate. Individual fins will be dual-gated. However, if dielectric caps 125 are not present gate dielectric layer 150 will be formed on the top surface of fins 140. In FIG. 8, the dashed lines show the hidden edges of gate dielectric layer 150 and depletion stop layer 155. While section line 10-10 is illustrated through end regions 142 of fins 140, a section through end regions 143 of fins 140 would be identical.

Figure 11:
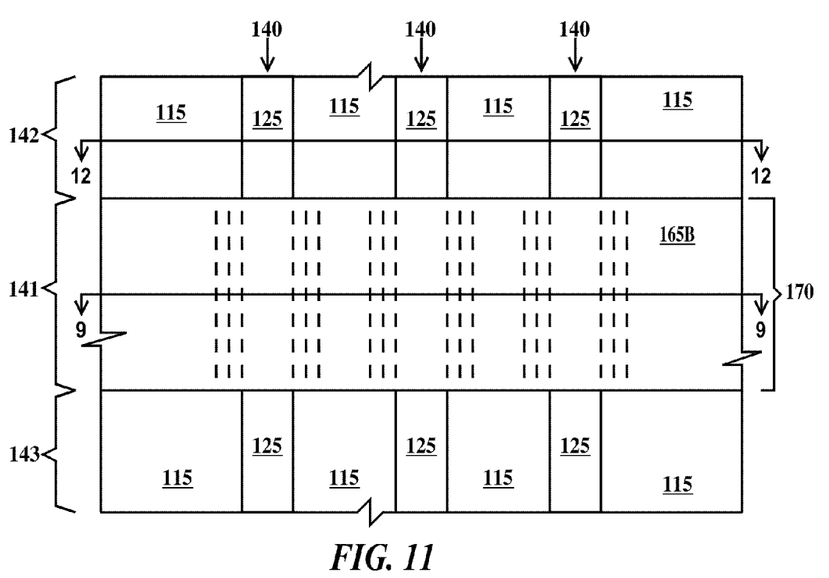
Figure 12:
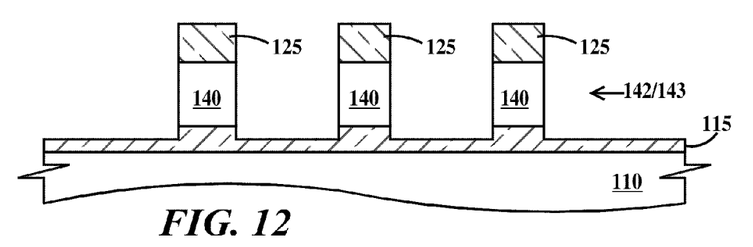

FIG. 11 is a top view and FIG. 12 is a cross-section view through line 12-12 of FIG. 11. Line 9-9 of FIG. 8 is shown for reference. Line 12-12 is in the same position as line 10-10 of FIG. 8. In FIGS. 11 and 12, depletion stop layer 155 and gate dielectric layer 155 (see FIG. 10) have been removed where not protected by gate 170. Thus caps 125 and sides of fins 140 are exposed. FIGS. 13, 14, 15, 16, 17, 18 and 19 are sections taken through the plane defined by line 12-12 of FIG. 11. While section line 12-12 is illustrated through end regions 142 of fins 140, a section through end regions 143 of fins 140 would be identical.

Figure 13:
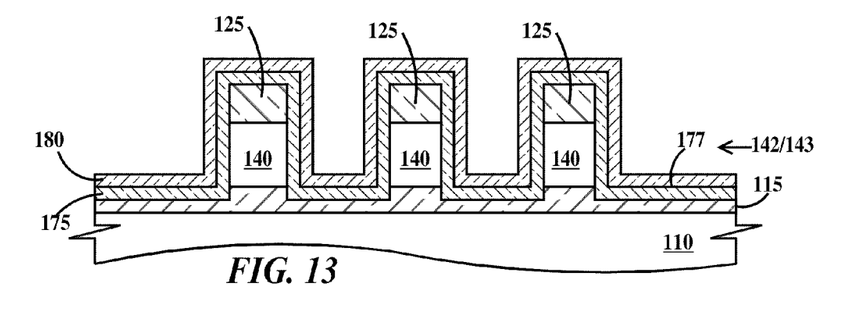

In FIG. 13, a conformal epitaxial stop layer 175 is formed on all exposed surfaces of BOX layer 115, fins 140 and caps 125. In one example epitaxial stop layer 175 is a silicon oxide. Also in FIG. 13, a conformal spacer layer 180 is formed on a top surface 177 of epitaxial stop layer 175. Epitaxial stop layer 175 prevents epitaxial growth in regions where spacer layer 180 will be removed. Spacer layer 180 is used in the fabrication of planar FETs (not shown) in regions of SOI substrate 100 (see FIG. 1) away from finFETs. In one example, epitaxial stop layer is silicon oxide. In one example, epitaxial stop layer 175 is between about 0.5 nm and about 20 nm thick. In one example, spacer layer 180 is silicon nitride. In one example, spacer layer 180 is between about 0.5 nm and about 20 nm thick.

Figure 14:
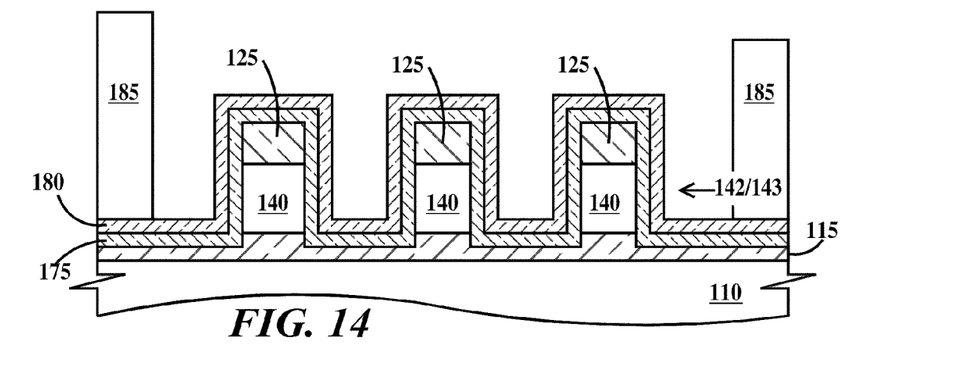

In FIG. 14, a patterned photoresist layer 185 is formed on spacer layer 180 over regions of substrate 110 where no epitaxial growth is desired.

Figure 15:
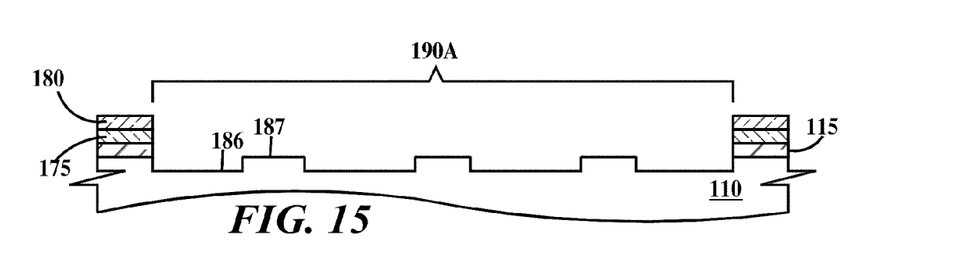

In FIG. 15, spacer layer 180, epitaxial stop layer 175, capping layer 125 (if present), ends 142 (see FIG. 8) of fins 140 and BOX layer 115 are removed where not protected by photoresist layer 185 (see FIG. 14) to form an exposed substrate region 190A of substrate 110. An exposed substrate region 190B (not shown in FIGS. 14-19) of substrate 110 is simultaneously formed with exposed substrate region 190A by removal of ends 143 (see FIG. 8) of fins 140. A surface 186 of region 190A of substrate 110 is recessed below a surface 187 of region 190A of substrate 110. Surfaces 186 and 187 are coplanar with {100} planes of substrate 110. Region 190B, not shown, has similar surfaces.

Figure 16:
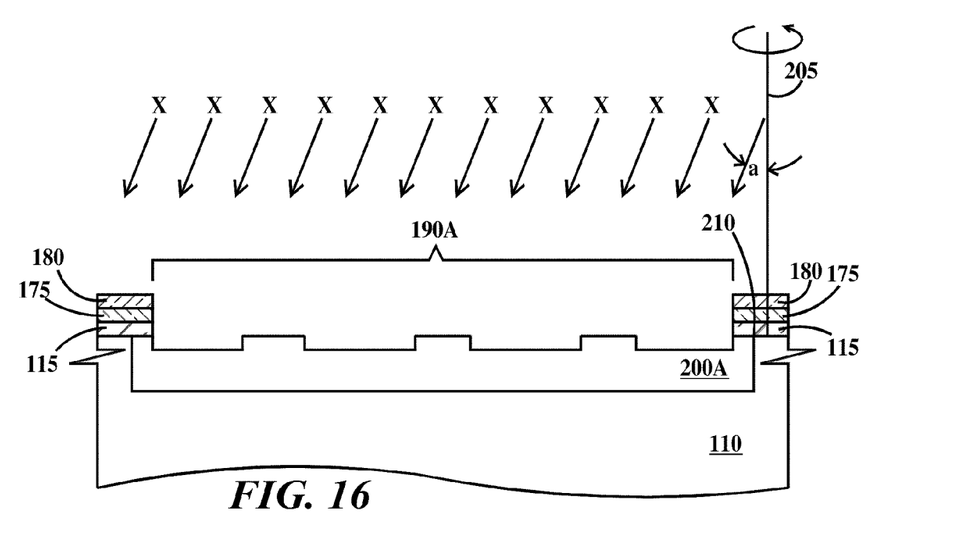
Figure 17:
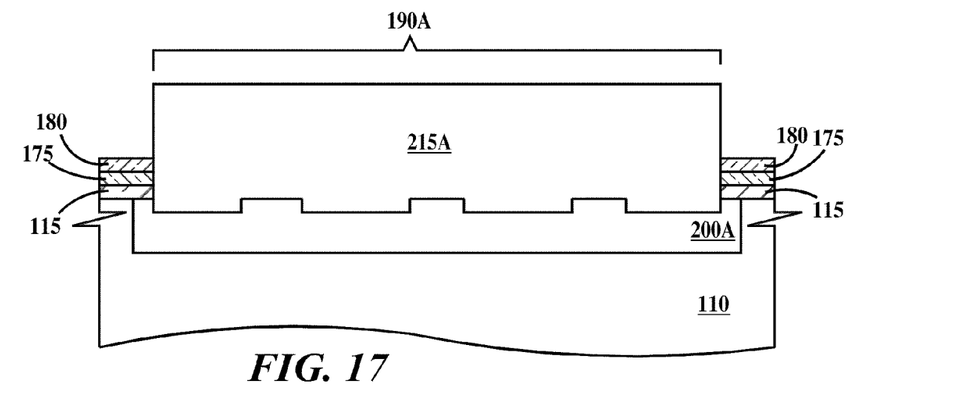

In FIG. 16, an angled ion implantation of a dopant species X is performed to form a well 200A in substrate 110 in exposed substrate region 190. An opposite well 200B (not shown in FIG. 16) is formed simultaneously with well 200A, see FIG. 20). The ion plantation is not performed into the central regions 143 of fins 140 or substrate 110 under gate 170 (see FIG. 11). A blocking mask (e.g., a patterned photoresist layer, not shown) is used to select where the ion-implantation is performed. When P-channel finFETs are being fabricated, well 200 is an N-well and dopant species X may contain arsenic or phosphorus. When N-channel finFETs are being fabricated, well 200 is a P-well and dopant species X may contain boron. The angled ion implantation is performed at an angle "a" measured from a central axis 205 of substrate 110 perpendicular to a top surface 210 of substrate 110 (i.e., SOI substrate 100 of FIG. 1). In one example, angle "a" is between about 10° and about 20°. The angled ion implantation is performed while substrate 110 is rotated about axis 205. After the ion implantation the blocking mask is removed. A vertical direction is defined a direction parallel to axis 205 and a horizontal direction is defined as a direction perpendicular to axis 205.

In FIG. 17, an epitaxial silicon block 215A is grown from well 200A. An opposite epitaxial silicon block 215B (not shown in FIG. 17) is formed simultaneously with epitaxial silicon block 215A, see FIG. 20). Epitaxial silicon growth occurs faster from {100} plane surfaces than from {110} plane surfaces. Also there are less crystal lattice irregularities in silicon grown from {100} plane surfaces than from {110} plane surfaces. Through not shown in FIG. 17, and epitaxial silicon growth also occurs from the now exposed ends of the central region 141 of fins 140 which surfaces are coplanar with a {110} crystal plane (see FIG. 20). Vertical growth from exposed substrate region 190A proceeds faster than horizontal growth from the ends of fins 140 (not shown in FIG. 17. However to ensure that epitaxial silicon block 215A is predominately from vertical growth, it is preferred that BOX layer 115 be thin enough so horizontal growth from the exposed ends of central regions 141 of fins 140 is minimized. The thickness of BOX layer 115 is thus an important control feature of the embodiments of the present invention. If the thickness of BOX layer is too great horizontal growth epitaxial silicon predominates. Horizontal growth epitaxial silicon includes more crystal defects (then vertical growth epitaxial silicon), which adversely effect control of carrier mobility and increase resistance. Horizontal growth epitaxial silicon reduces desirable induced stress in the channels of the fins, which in turn adversely effects control of carrier mobilities.

Figure 18:
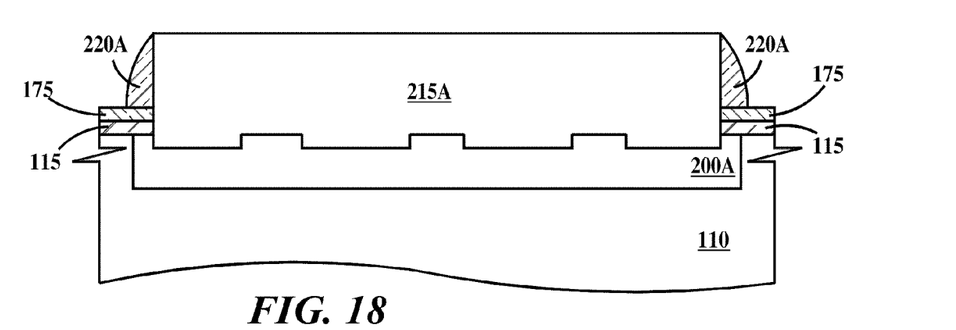

In FIG. 18, spacer layer 180 (see FIG. 17) is remove and dielectric sidewall spacers 220A are formed on sidewalls of epitaxial silicon block 215A (and 215B, not shown) and sidewall spacers 220B are formed on the sidewalls of gate 170 (see FIG. 20) simultaneously with sidewall spacers 220A. Sidewall spacers are formed by depositing a conformal layer and then performing a directional reactive ion etch to remove the layer from horizontal surfaces.

Figure 19:
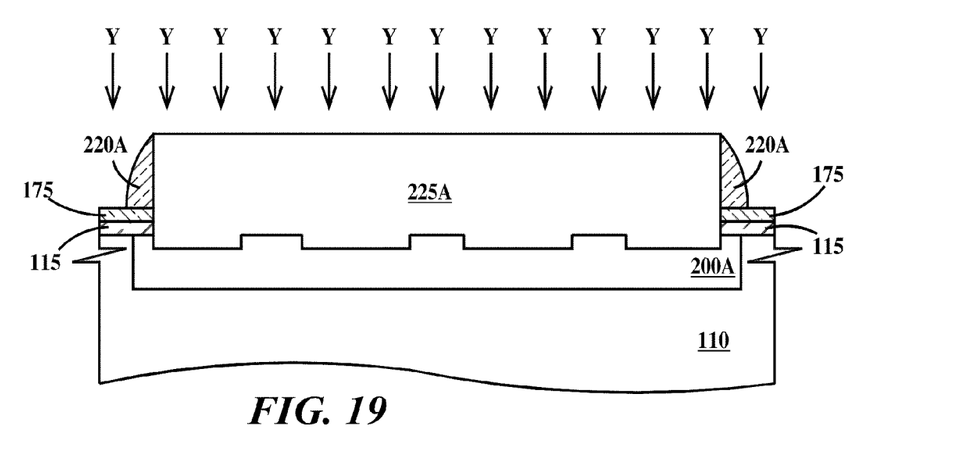

In FIG. 19, an ion implantation of a dopant species Y is performed to form a merged source/drain 225A comprising epitaxial silicon block 215A. An opposite merged source/drain 225B (not shown in FIG. 19) is formed simultaneously with merged source/drain 225A, see FIG. 20). A blocking mask (e.g., a patterned photoresist layer, not shown) is used select where the ion-implantation is performed. When P-channel finFETs are being fabricated, N-channel finFETs are protected by the blocking mask and vice versa. When N-channel finFETs are being fabricated, dopant species Y may contain arsenic or phosphorus. When P-channel finFETs are being fabricated, dopant species Y may contain boron.

Figure 20:
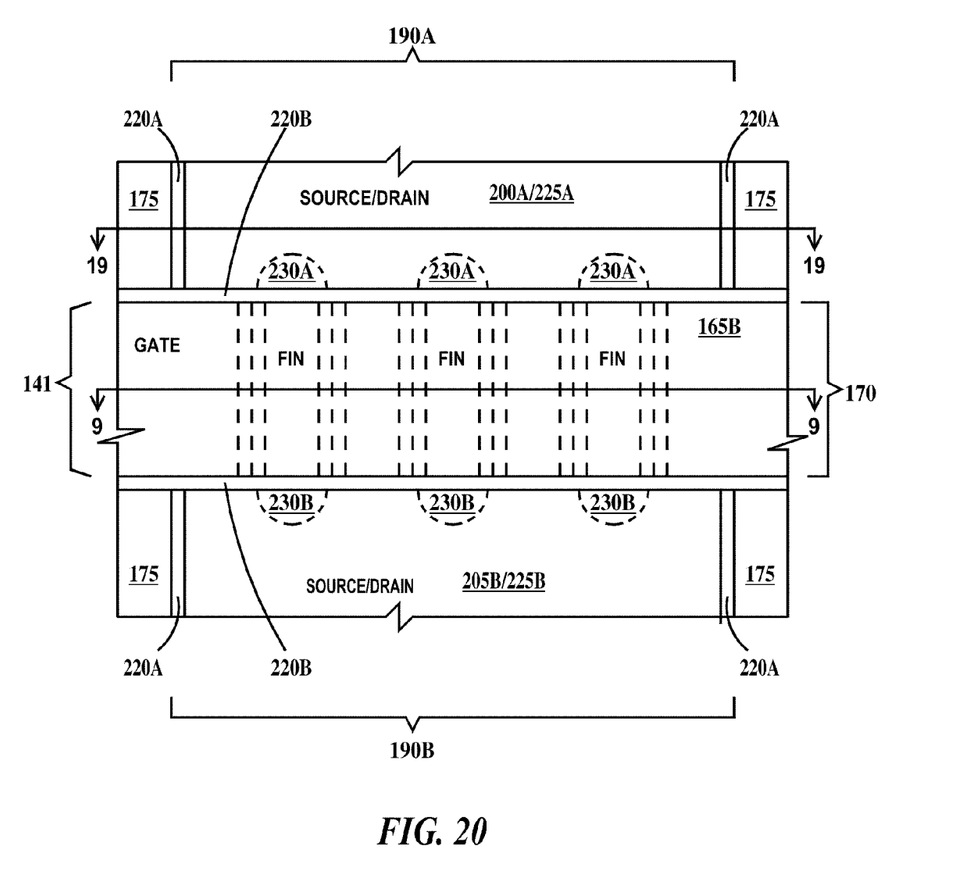

FIG. 20 is a top view of a completed fin-FET according to embodiments of the present invention. Gate 170 is formed over central region 141 of fins 140 which are the channel regions of the finFET. Merged source/drains 225A and 225B include respective regions of epitaxial silicon 230A and 230B grown from the ends of central regions 141 of fins 140. Merged source/drains 225A and 225B are formed on opposite sides of gate 170. Note sidewall spacers 220A on source/drains 225A and 225B and sidewall spacers 220B on the sidewalls of gate 170.

Thus, the embodiments of the present invention provide finFETs and method of making finFETs with decreased parasitic resistance as the fin width is scaled down in size compared to conventional finFETs.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A structure, comprising:
   two or more silicon fins on a top surface of an insulating layer, said insulating layer on a silicon substrate, each fin of said two or more fins having opposite sidewalls connecting opposite first and second ends;
   a gate dielectric layer on said sidewalls of each fin of said two or more fins;
   an electrically conductive gate over said gate dielectric layer;
   first and second regions of said silicon substrate on opposite sides of said gate;
   a first merged source/drain comprising first epitaxial silicon regions extending from said first region of said silicon substrate, through said insulating layer, and abutting second epitaxial regions extending from said first ends of each fin of said two or more fins; and
   a second merged source/drain comprising third epitaxial silicon regions extending from said second region of said silicon substrate, through said insulating layer, and abutting fourth epitaxial regions extending from said second ends of each fin of said two or more fins.

2. The structure of claim 1, wherein said insulating layer has a thickness between about 20 nm and about 40 nm.

3. The structure of claim 1, further including:
   dielectric caps on respective top surfaces of each fin of said two or more fins, said dielectric caps between said respective top surfaces of each fin of said two or more fins and said gate dielectric layer.

4. The structure of claim 1, further including:
   an electrically conductive depletion stop layer on said gate dielectric layer.

5. The structure of claim 1, further including:
   a first P-well or N-well in said first silicon region of said substrate; and
   a second P-well or N-well in said second silicon region of said substrate.

6. The structure of claim 1, further including:
   recesses part way through said insulating layer, said recesses adjacent to respective sides of each fin of said two or more fins.

7. The structure of claim 1, further including:
   recesses part way through said silicon substrate in said first and second regions of said silicon substrate.

8. The structure of claim 1, wherein said gate dielectric comprises material having a relative permittivity above about 10 and selected from the group consisting of metal oxides, $Ta_2O_5$, $BaTiO_3$, $HfO_2$, $ZrO_2$, $Al_2O_3$, metal silicates, $HfSi_xO_y$, or $HfSi_xO_yN_z$ or combinations thereof.

9. The structure of claim 1, wherein surfaces of said first and second regions of said silicon substrate are coplanar with a {100} crystal plane of said silicon substrate and said first and second ends of said each fin of said two or more fins are coplanar with a {110} crystal plane of each fin of said two or more fins.

10. The structure of claim 1, wherein said two or more fins are regions of a silicon layer of a silicon-on insulator substrate, said silicon-on-insulator substrate comprising said silicon layer, separated from said silicon substrate by said insulating layer, said insulating layer comprising silicon oxide.

11. The structure of claim 1, further including:
   a dielectric spacer on sidewalls of said first merged source/drain and second merged source/drain.

12. The structure of claim 1, wherein said gate dielectric is between 0.5 nm and 20 nm thick.

13. The structure of claim 4, wherein said stop layer comprises a material selected from the group consisting of Ti, Ta, W, TiN and TaN.

14. The structure of claim 4, wherein said stop layer is between 0.5 nm and 20 nm thick.

15. The structure of claim 3, wherein said dielectric caps have a thickness no greater than 200 nm.

16. The structure of claim 10, wherein insulating layer has a thickness between 20 nm and 40 nm.

17. The structure of claim 10, wherein silicon layer has a thickness between 5 nm and 100 nm.

18. The structure of claim 1, wherein each fin of said two or more fins comprise a tri-gated finFET.

19. The structure of claim 3, wherein each fin of said two or more fins comprise a dual-gated finFET.

20. The structure of claim 1, wherein said two or more fins each have a width between 5 nm and 40 nm and are spaced apart a distance between 15 nm and 100 nm.

* * * * *